United States Patent [19]

Jones

[11] Patent Number: 4,935,941
[45] Date of Patent: Jun. 19, 1990

[54] MULTIPLE FREQUENCY DATA RECOVERY SYSTEM

[75] Inventor: William H. Jones, Morgan Hill, Calif.

[73] Assignee: Konica Corporation, Tokyo, Japan

[21] Appl. No.: 176,044

[22] Filed: Mar. 30, 1988

[51] Int. Cl.$^5$ .............................................. H04L 27/16
[52] U.S. Cl. .......................................... 375/80; 360/51
[58] Field of Search .................. 370/108; 455/62, 214; 375/80, 81, 120; 329/110, 136, 122, 111, 307, 309, 325; 360/48, 51, 73.03; 328/72

[56] References Cited

U.S. PATENT DOCUMENTS

| | | | |
|---|---|---|---|
| 3,922,613 | 11/1975 | Allen et al. | 329/104 |
| 4,365,210 | 12/1982 | Harrington et al. | 375/120 |
| 4,534,044 | 8/1985 | Funke et al. | 360/51 |
| 4,584,617 | 4/1986 | Libove et al. | 360/39 |
| 4,670,888 | 6/1987 | Smith, III | 375/62 |
| 4,724,493 | 2/1988 | Nakamura | 360/51 |
| 4,773,036 | 9/1988 | Berens et al. | 364/900 |

Primary Examiner—Benedict V. Safourek
Assistant Examiner—Marianne Huseman
Attorney, Agent, or Firm—Thomas R. Schatzel

[57] ABSTRACT

A single data recovery integrated circuit is used to achieve a data recovery system which can operate at multiple selected frequencies. A time delay adjustment circuit is connected to the data recovery IC and sets the time delay. A frequency controller circuit is connected to the data recovery IC and sets the data recovery IC at the desired frequency. A frequency adjustment circuit is connected to the data recovery IC and adjusts an oscillator of the data recovery IC. A stabilizer circuit is connected to the frequency controller circuit and the data recovery IC and ensures the integrity of the phase locked loop.

6 Claims, 1 Drawing Sheet

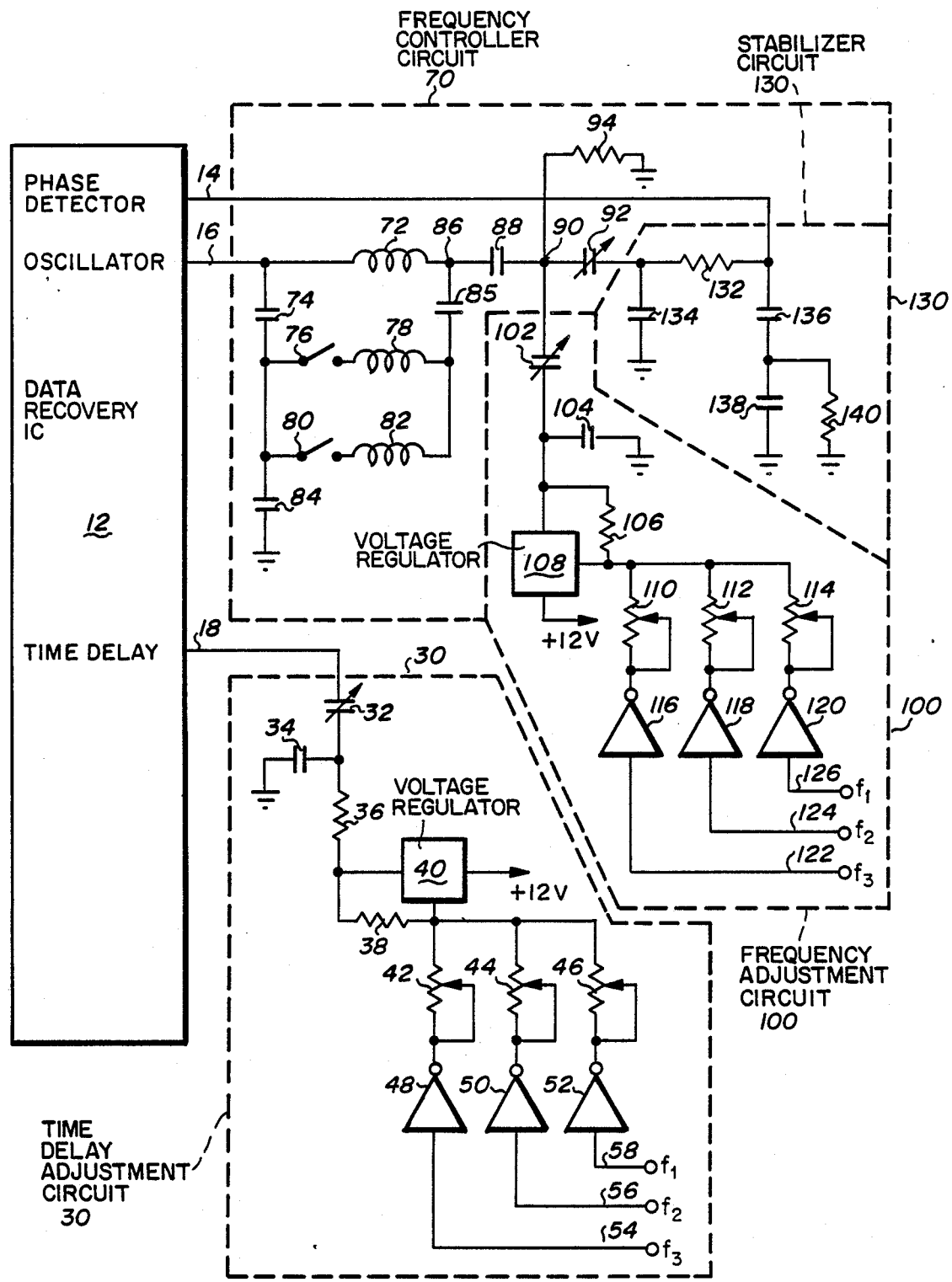
Fig_1

MULTIPLE FREQUENCY DATA RECOVERY SYSTEM

BACKGROUND OF THE INVENTION

1. Field of the Invention

The present invention relates generally to data recovery systems and more particularly to multiple frequency data recovery systems for use in disk drives.

2. Description of the Prior Art

Data storage devices such as tape and disk drives are well known in the art. These systems use various clocking and data recovery systems. Examples include U.S. Pat. No. 4,617,599, issued to T. Noguchi, et al; U.S. Pat. No. 4,433,424, issued to L. Taber, et al; and U.S. Pat. No. 4,357,707, issued to D. Delury.

Some data storage devices require the reading of various densities or bit rates when recovering data from the media used. This requirement occurs in disk drives as well as tape drives. For example, a standard 5¼ inch floppy disk drive (FDD) uses forty-eight tracks per inch and has a data rate of five hundred kilobits per second. A more efficient version of the FDD has ninety-six tracks per inch with a transfer rate of eight hundred kilobits per second. Recently, Konica Technology, Inc. has introduced a 5¼ inch FDD which achieves four hundred and eighty tracks per inch and a transfer rate of sixteen hundred kilobits per second. This new FDD is also compatable with the older forty-eight and ninety-six tracks per inch disks.

In order to accomplish the recovery of data on disks having three different densities, it is necessary to have three selectable phase locked oscillators (PLO) plus three selectable delays for optimization of the data recovery system. Present day drives do not generally use discrete PLOs. Instead the data recovery system, including the PLO, are constructed on a single integrated circuit (IC).

One way to accomodate data recovery in a three density system is to use three different data recovery ICs. However, this results in increased cost and space. What is needed is a way to adapt a single data recovery IC for use at multiple frequencies.

SUMMARY OF THE PRESENT INVENTION

It is an object of the present invention to provide a multiple frequency data recovery system which is compact and inexpensive.

It is another object of the present invention to provide a multiple frequency data recovery system which requires only a single data recovery IC.

Briefly, in a preferred embodiment, the present invention comprises a single data recovery IC. A time delay adjustment circuit is connected to the data recovery IC and adjusts the clock delay. A frequency controller circuit is connected to the data recovery IC and sets the data recovery IC at a desired frequency. A frequency adjustment circuit is connected to the frequency controller circuit and optimizes the oscillation of the data recovery IC. A stabilizer circuit is connected to the frequency controller circuit and the data recovery IC and stabilizes the phase locked loop.

It is an advantage of the present invention in that it provides a multiple frequency data recovery system which is compact and inexpensive.

It is another advantage of the present invention in that it provides a multiple frequency data recovery system which requires only a single data recovery IC.

These and other objects and advantages of the present invention will no doubt become obvious to those of ordinary skill in the art after having read the following detailed description of the preferred embodiment which is illustrated in the various drawing figures.

IN THE DRAWINGS

FIG. 1 is a circuit diagram of the present invention.

DESCRIPTION OF THE PREFERRED EMBODIMENT

FIG. 1 shows a circuit diagram of a multiple frequency data recovery system of the present invention and is designated by the general reference number 10. System 10 has a data recovery IC chip 12. IC 12 may be an OMTI 5070 VCO/Encode/Decode chip. IC 12 has a phase detector terminal 14, an oscillator terminal 16, and a time delay terminal 18. A time delay adjustment circuit 30 is connected to terminal 18. Circuit 30 comprises a varactor 32 which is connected to terminal 18. A capacitor 34 is connected between varactor 32 and ground. A resistor 36 is connected to capacitor 34. A resistor 38 is connected to resistor 36. A voltage regulator 40 is connected in parallel with resistor 38. A plurality of variable resistors 42, 44 and 46 are connected to resistor 38 and regulator 40. A plurality of inverters 48, 50 and 52 are connected to variable resistors 42, 44 and 46, respectively. A plurality of lines 54, 56 and 58 are connected to inverters 48, 50 and 52, respectively.

A frequency controller circuit 70 is connected to terminal 16 of IC 12. Circuit 70 comprises an inductor 72 connected to terminal 16. A capacitor 74 is connected to terminal 16. An FET switch 76 and an inductor 78 are connected in series to capacitor 74. An FET switch 80 and an inductor 82 are arranged together in series, parallel with switch 76 and inductor 78. A capacitor 84 is connected between capacitor 74 and ground. Inductors 78 and 82 are connected to a capacitor 85. Inductor 72 and capacitor 85 are connected to a point 86. A capacitor 88 is connected between point 86 and a point 90. A varactor 92 is connected to point 90. A resistor 94 is connected between point 90 and ground.

A frequency adjustment circuit 100 is connected to the frequency controller circuit 70. A varactor 102 is connected to point 90. A capacitor 104 is connected between varactor 102 and ground. A resistor 106 is connected to varactor 102. A voltage regulator 108 is connected in parallel with resistor 106. A plurality of variable resistors 110, 112 and 114 are connected to resistor 106. A plurality of inverters 116, 118 and 120 are connected to variable resistor 110, 112 and 114, respectively. A plurality of lines 122, 124 and 126 are connected to inverters 116, 118 and 120, respectively.

A stabilizer circuit 130 is connected to frequency controller circuit 70 and IC 12. A resistor 132 is connected between varactor 92 and terminal 14. A capacitor 134 is connected between varactor 92 and ground. A capacitor 136 is connected to terminal 114. A capacitor 138 is connected between capacitor 136 and ground. A resistor 140 is connected between capacitor 136 and ground.

In operation, the system 10 is installed in a data storage device, such as a disk drive. In a preferred application, system 10 is used in a disk drive which can accomodate multiple types of disk densities and their respective data transfer rates.

The data recovery IC 12 acts as an encoder/decoder. In a write mode, the IC 12 receives an input write signal from the controller, encodes it, and outputs it to a transducer for writing on a disk. In the read mode, the IC 12 receives an input read signal from the transducer of the disk, decodes it, and outputs the decoded signal to the controller. The terminals for these input and output signals are not shown in FIG. 1.

In order for a single data recovery IC 12 to accomodate multiple data transfer rates, the system 10 acts to adjust an internal oscillator inside IC 12 to the frequency required. The present invention, as shown in FIG. 1, is designed to accomodate up to three different data transfer rates. However, system 10 could be modified to accomodate any number of data transfer rates.

IC 12 provides a one-quarter bit cell time delay in preparation for the reception of the incoming data signal. This time delay must be set for each frequency. Time delay circuit 30 provides this adjustment. A high logic signal, f1, f2 or f3 is sent from the controller to circuit 30 depending upon the desired frequency. For example, if the system 10 is set for a first frequency, f1 would be a high voltage logic signal, and f2 and f3 would be low voltage logic signals. The high f1 signal is inverted to a low signal at inverter 52. This low signal enables the adjustable resistor 46 while resistors 42 and 44 remain ungrounded.

The time delay of IC 12 is set by varactor 32. Varactor 32 is driven by voltage regulator 40 and a series of trimming resistors 36 and 38 and either resistor 42, 44 or 46. The exact delay depends on which of resistors 42, 44 or 46 has been enabled.

The IC 12 contains an internal oscillator which must also be set. Frequency controller circuit 70 sets the frequency of this oscillator. For a first frequency, the controller sets FET switches 76 and 80 in an open position. The feed-back signal from terminal 14 passes through the stabilizer circuit 130, varactor 92, capacitor 88 and inductor 72 and sets the oscillator in IC 12 to run at the first frequency. A second and higher frequency is achieved when the controller sets FET switch 76 closed and FET switch 80 open. The inductors 72 and 78 in parallel result in a reduced inductance and this increases the frequency of the oscillator in IC 12. A third and higher frequency is achieved when the controller sets FET switches 76 and 80 in the closed position. The three inductors 72, 78 and 82 in parallel result in a decreased inductance and a higher frequency for the IC 12.

While the frequency controller circuit 70 sets the frequency range to be covered by the data recovery IC 12, it is still necessary to set the oscillator natural frequency by means of the frequency adjustment circuit 100. Setting the oscillator of IC 12 to the correct frequency improves the performance of the phase locked loop, since it sets the phase detector output from terminal 14 to the center of the output voltage excursion. Varactor 102 controls the adjustment. Varactor 102 is in turn controlled by the combination of voltage regulator 108, resistor 106 and either resistor 110, 112 or 114. Depending upon which data rate and frequency is desired, the controller will enable resistor 110, 112 or 114 by sending a high logic signal f3, f2 or f1, respectively. In response, varactor 102 sets the oscillator to the natural frequency.

The stabilizer circuit 130 is used to stabilize the phase locked loop signal from phase detector terminal 14. The circuit 130 ensures that the phase locked loop will not go to an unstable condition, but will remain phase locked even when the frequency of system 10 is changed.

The present invention thus achieves a multiple frequency data recovery system by using only a single data recovery chip. This helps to reduce the size and cost of a data storage system.

Other embodiments of the present invention are possible. Although an OMTI 5070 chip is used in the preferred embodiment of the system 10, other data recovery ICs could also be used. Some of these other data recovery ICs would require the use of capacitors in place of inductors 72, 78 and 82 for frequency selection.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A multiple frequency data recovery system comprising:
   a data recovery integrated circuit (IC) having a phase locked oscillator;
   a time delay adjustment circuit connected to the data recovery IC for adjusting a time delay for the data recovery IC;
   a frequency controller circuit connected to the data recovery IC for selecting a frequency for said phase locked oscillator of the data recovery IC; and
   a frequency adjustment circuit connected to the frequency controller circuit for adjusting the frequency of said phase locked oscillator of the data recovery IC to its natural frequency.

2. The system of claim 1 wherein,
   the time delay circuit is comprised of a varactor connected to said phase locked oscillator of the IC, a capacitor connected between said varactor and ground, a first resistor connected to said varactor, a second resistor connected to said first resistor, a voltage regulator connected in parallel with said second resistor, and a plurality of logic controlled resistors connected to said second resistor.

3. The system of claim 1 wherein,
   the frequency controller circuit comprises a selectable inductor connected to said phase locked oscillator of the IC, a capacitor connected to said selectable inductor, and a varactor connected to said capacitor and a phase detector terminal of the IC.

4. The system of claim 1 wherein,
   the frequency adjustment circuit comprises a varactor connected to the frequency controller circuit, a capacitor connected intermediate said varactor and ground, a first resistor connected to said varactor, a voltage regulator connected in parallel with said resistor, and a plurality of logic controlled resistors connected to said resistor.

5. The system of claim 1 further including,
   a stabilizer circuit connected between the data recovery IC and the frequency controller circuit for stabilizing a phase locked loop.

6. The system of claim 5 wherein,
said stabilizer circuit comprises a first resistor connected between a phase detector terminal of the IC and the frequency controller circuit, a first capacitor connected between the frequency controller circuit and ground, a second capacitor connected to said phase detector terminal of the IC, a third capacitor connected between said second capacitor and ground, and a second resistor connected in parallel with said third capacitor.

* * * * *